(12) United States Patent
Guo

(10) Patent No.: US 12,181,510 B2
(45) Date of Patent: Dec. 31, 2024

(54) INSULATION DETECTION DEVICE AND INSULATION DETECTION METHOD FOR COOLING PLATE OF BATTERY PACK

(71) Applicant: Lucky Link (Jia Xing) EV Technology Co., Ltd, Jiaxing (CN)

(72) Inventor: Li Guo, Jiaxing (CN)

(73) Assignee: Lucky Link (Jia Xing) EV Technology Co., Ltd, Jiaxing (CN)

( * ) Notice: Subject to any disclaimer, the term of this patent is extended or adjusted under 35 U.S.C. 154(b) by 69 days.

(21) Appl. No.: 17/956,026

(22) Filed: Sep. 29, 2022

(65) Prior Publication Data

US 2023/0333155 A1    Oct. 19, 2023

(30) Foreign Application Priority Data

Apr. 14, 2022  (CN) .......................... 202210401628.7

(51) Int. Cl.
| | |
|---|---|
| *G01R 31/12* | (2020.01) |
| *H01M 6/50* | (2006.01) |
| *H01M 10/48* | (2006.01) |
| *H01M 10/613* | (2014.01) |
| *H01M 10/6554* | (2014.01) |

(52) U.S. Cl.
CPC ...... *G01R 31/1263* (2013.01); *H01M 6/5038* (2013.01); *H01M 6/5044* (2013.01); *H01M 10/48* (2013.01); *H01M 10/613* (2015.04); *H01M 10/6554* (2015.04)

(58) Field of Classification Search
CPC .. G01R 31/1263; G01R 1/02; G01R 31/1227; G01R 1/0408; H01M 6/5038; H01M 6/5044; H01M 10/48; H01M 10/613; H01M 10/6554; H01M 10/4285; Y02E 60/10
See application file for complete search history.

(56) References Cited

U.S. PATENT DOCUMENTS

| | | | | |
|---|---|---|---|---|
| 3,917,995 A | * | 11/1975 | Clinton ................. | G01R 31/59 324/517 |
| 4,998,070 A | * | 3/1991 | Rosenberg ......... | G01R 31/1263 324/559 |
| 5,397,996 A | * | 3/1995 | Keezer ................. | G01R 31/52 324/133 |
| 5,936,536 A | * | 8/1999 | Morris ................. | A61B 18/14 340/693.5 |

(Continued)

*Primary Examiner* — Daniel R Miller
(74) *Attorney, Agent, or Firm* — Enable IP P.C.

(57) ABSTRACT

An insulation detection device and an insulation detection method for a cooling plate of a battery pack are provided. The device includes a detection position for placing the cooling plate of the battery pack, conductive cotton, a first conductive element, a second conductive element, and an insulation detector. The cooling plate of the battery pack is hollow, and an outer surface of the cooling plate of the battery pack is coated with an insulation coating. The conductive cotton is arranged in the detection position for wrapping the cooling plate of the battery pack. The first conductive element is connected to an inner wall of the cooling plate of the battery pack. The second conductive element is connected to the conductive cotton. A first end of the insulation detector is connected to the first conductive element, and a second end of the insulation detector is connected to the second conductive element.

7 Claims, 3 Drawing Sheets

(56) References Cited

U.S. PATENT DOCUMENTS

| | | | |
|---|---|---|---|
| 7,489,140 B1 * | 2/2009 | Butterworth | G01R 31/59 439/840 |
| 2011/0148432 A1 * | 6/2011 | Apfelthaler | H01L 31/02005 324/551 |
| 2020/0227794 A1 * | 7/2020 | Mazza | H01M 10/6567 |

* cited by examiner

INSULATION DETECTION DEVICE AND INSULATION DETECTION METHOD FOR COOLING PLATE OF BATTERY PACK

CROSS REFERENCE TO RELATED APPLICATION

This application claims priority to Chinese Patent Application No. 202210401628.7, filed on Apr. 14, 2022, which is hereby incorporated by reference in its entirety.

FIELD

The present disclosure relates to the technical field of new energy, and in particular to an insulation detection device and an insulation detection method for a cooling plate of a battery pack.

BACKGROUND

With the shortage of conventional energy and the increasingly serious environmental problems, the development of new energy vehicles, that may replace the conventional vehicles, has become a focus of attention. The safety of a battery pack, as a core component of a new energy vehicle, is very important.

The cooling plate of the battery pack operates as follows. The excess heat generated by the operation of the battery is transferred by contact with a surface of a cooling plate of the battery pack. Due to flowing liquid having a large heat transfer coefficient, a liquid cooling system may transfer high heat based on the flow of the liquid. Thus, high heat is taken away by the cooling liquid passing through an internal flow channel of a device.

SUMMARY

The content part of the present disclosure is provided to introduce concepts in a brief form, and these concepts are to be described in detail in the following embodiments. The content of the present disclosure is not intended to identify the key features or essential features of the claimed technical solutions, nor is it intended to be used to limit the scope of the claimed technical solutions.

In a first aspect, an insulation detection device for a cooling plate of a battery pack is provided according to an embodiment of the present disclosure. The insulation detection device includes: a detection position for placing the cooling plate of the battery pack, conductive cotton, a first conductive element, a second conductive element, and an insulation detector. The cooling plate of the battery pack is hollow, and an outer surface of the cooling plate of the battery pack is coated with an insulation coating. The conductive cotton is arranged in the detection position for wrapping the cooling plate of the battery pack. The first conductive element is connected to an inner wall of the cooling plate of the battery pack. The second conductive element is connected to the conductive cotton. A first end of the insulation detector is connected to the first conductive element, and a second end of the insulation detector is connected to the second conductive element.

In a second aspect, an insulation detection method for a cooling plate of a battery pack is provided according to an embodiment of the present disclosure. The method includes: placing the cooling plate of the battery pack wrapped with the conductive cotton in the detection position, where the cooling plate of the battery pack is hollow, and the outer surface of the cooling plate of the battery pack is coated with the insulation coating; connecting the first conductive element to the inner wall of the cooling plate of the battery pack; connecting the second conductive element to the conductive cotton; connecting the first end of the insulation detector to the first conductive element, and connecting the second end of the insulation detector to the second conductive element; and turning on the insulation detector, and determining a dielectric strength of the insulation coating of the cooling plate of the battery pack based on a measured value obtained by the insulation detector.

With the insulation detection device for a cooling plate of a battery pack and the method for a cooling plate of a battery pack according to the embodiments of the present disclosure, the detection position is arranged, the conductive cotton for wrapping the cooling plate of the battery pack is arranged in the detection position, and the two ends of the insulation detector are respectively connected to the conductive cotton and the inner wall of the cooling plate of the battery pack through the first conductive element and the second conductive element. Thus, it is determined by using the insulation detector whether an electrical path can be formed between the inner wall and the outer surface of the cooling plate of the battery pack, thereby determining the degree of insulation of the insulation coating of the cooling plate of the battery pack.

Specifically, in a case that the cooling plate of the battery pack is connected to the conductive cotton due to a defect in the insulation coating on the outer surface of the battery pack, the resistance between the inner wall of the cooling plate of the battery pack and the conductive cotton is small, and an electrical path is formed; and in a case that the insulation coating on the outer surface of the cooling plate of the battery pack has no defect, the inner wall of the cooling plate of the battery pack is not connected to the conductive cotton, and the resistance between the cooling plate of the battery pack and the conductive cotton is large, and it may be determined that the cooling plate and the conductive cotton are insulated. Thereby, the insulation of the outer surface of the cooling plate of the battery pack can be accurately detected.

BRIEF DESCRIPTION OF THE DRAWINGS

The above and other features, advantages and aspects of the embodiments of the present disclosure will be more apparent in conjunction with the accompanying drawings and with reference to the following embodiments. Throughout the drawings, the same or similar reference numerals represent the same or similar elements. It should be understood that the drawings are schematic and the originals and elements are unnecessarily drawn to scale.

Figure 1:
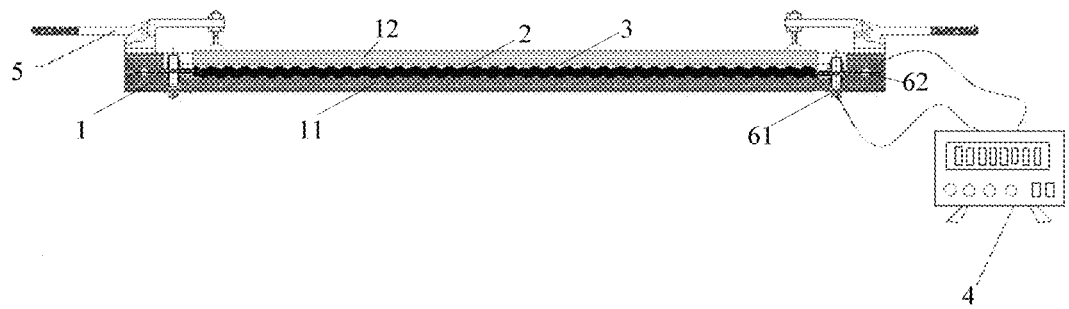
FIG. 1 is a schematic structural diagram of an insulation detection device according to an embodiment of the present disclosure.

Reference numerals are listed as follows:

1 detection position 11 bottom plate
12 cover plate
13 baffle plate
2 cooling plate of battery pack
21 first surface
22 second surface
3 conductive cotton
4 insulation detector
5 pressing apparatus
51 first type of pressing element
521 pressurizing cylinder
522 sliding sleeve
531 sliding shaft
532 spring
533 slideway
61 first conductive element
62 second conductive element

DETAILED DESCRIPTION OF THE EMBODIMENTS

The embodiments of the present disclosure are described in detail below with reference to the accompanying drawings. Although the drawings show some embodiments of the present disclosure, it should be understood that the present disclosure can be implemented in various forms and is not limited to the embodiments. The embodiments are provided for a more thorough and complete understanding of the present disclosure. It should be understood that the drawings and the embodiments in the present disclosure are only illustrative of the disclosure, and are not intended to limit the protection scope of the present disclosure.

It should be understood that the steps of the method according to the embodiments of the present disclosure may be performed in different orders, and/or be performed in parallel. In addition, the method embodiments may include additional steps and/or omit to perform the illustrated steps, not limiting the scope of the present disclosure.

The term "including" and its variants as used herein are open-ended includes, that is, "including but not limited to". The term "based on" means "based at least in part on". The term "one embodiment" means "at least one embodiment". The term "another embodiment" means "at least one additional embodiment". The term "some embodiments" means "at least some embodiments". Definitions of other terms are provided in the following description.

It should be noted that, the terms "first" "second" and so on mentioned in the present disclosure are only used to distinguishing different apparatuses, modules or units, rather than limit an order of functions performed by the apparatus, module or unit or limit interdependence.

It should be noted that, the terms "one" and "multiple" mentioned in the present disclosure are schematic rather than restrictive, and should be understood as "one or more" by those skilled in the art, otherwise explicitly illustrated in the context.

Names of messages or information interacted between multiple apparatuses in the embodiments of the present disclosure are illustrative rather than limit the scope of the message or information.

Reference is made to FIG. 1, which shows a schematic structural diagram of an insulation detection device according to an embodiment of the present disclosure. As shown in FIG. 1, the insulation detection device may include: a detection position 1, conductive cotton 3, an insulation detector 4, a first conductive element 61, and a second conductive element 62.

In the embodiment, the detection position 1 is arranged for placing a cooling plate 2 of a battery pack.

The cooling plate of the battery pack is hollow, and an outer surface of the cooling plate of the battery pack is coated with an insulation coating.

The detection position may be elongated and slot-shaped. The detection position may be made of insulating material, for example, the detection position may be made of bakelite. The detection position has the features of insulation, no static electricity, wear resistance and high temperature resistance.

In some embodiments, referring to FIG. 1, the detection position 1 may include a bottom plate 11 and a cover plate 12. Both the bottom plate 11 and the cover plate 12 may be made of insulating materials.

In some embodiments, the detection position may be placed on a substrate of a detection table.

In an embodiment, the detection position may include a side plate. The detection position may have a structure surrounded by a bottom plate, a side plate and a cover plate. The detection position is in a shape of a cube which is hollow. The cooling plate of the battery pack wrapped with conductive cotton may be placed at a position in the hollow of the detection position.

In the embodiment, the conductive cotton 3 may be arranged in the detection position for wrapping the cooling plate of the battery pack.

In some embodiments, the conductive cotton may include first direction conductive cotton and second direction conductive cotton. The first direction conductive cotton may be arranged to be in contact with the bottom plate and the cover plate of the detection position, so the first direction conductive cotton is also called as upper and lower conductive cotton.

The second direction conductive cotton may be arranged to be in contact with the side plate of the detection position, so the second direction conductive cotton is also called left and right conductive cotton.

In the embodiment, the first conductive element 61 is connected to an inner wall of the cooling plate of the battery pack, and the second conductive element 62 is connected to the conductive cotton.

It should be understood that the conductive cotton wraps the outer surface of the cooling plate of the battery pack, and the second conductive element is connected to the conductive cotton. That is, the second conductive element may repeatedly contact the insulation coating applied on the outer surface of the cooling plate of the battery pack.

As an example, the first conductive element may be any form of conductive medium drawn from the inner wall of the cooling plate of the battery pack.

As an example, the second conductive element may be any form of conductive medium directly or indirectly connected to the conductive cotton.

In the embodiment, a first end of the insulation detector is connected to the first conductive element, and a second end of the insulation detector is connected to the second conductive element.

The first end of the insulation detector may be electrically connected to the inner wall of the cooling plate of the battery pack, and the second end of the insulation detector may be fully contacted with the insulation coating laid on the outer surface of the cooling plate of the battery pack. In a case that there is a defect at any position of the insulation coating (resulting in poor insulation effect), the second end may be electrically connected to the outer surface of the cooling plate of the battery pack under the position with defect through the conductive cotton, and the second end may be electrically connected to the inner wall of the cooling plate of the battery pack if the base material of the cooling plate of the battery pack is made of an alloy material (which is conductive).

It should be noted that in the insulation detection device for a cooling plate of a battery pack according to the embodiments, the detection position is arranged, the conductive cotton for wrapping the cooling plate of the battery pack is arranged in the detection position, and the two ends of the insulation detector are respectively connected to the conductive cotton and the inner wall of the cooling plate of the battery pack through the first conductive element and the second conductive element. Thus, it is determined by using the insulation detector whether an electrical path can be formed between the inner wall and the outer surface of the cooling plate of the battery pack, thereby determining the degree of insulation of the insulation coating of the cooling plate of the battery pack.

Specifically, in a case that the base material of the cooling plate of the battery pack is connected to the conductive cotton due to a defect in the insulation coating on the outer surface of the battery pack, the resistance between the inner wall of the cooling plate of the battery pack and the conductive cotton is small, and an electrical path is formed; and in a case that the insulation coating on the outer surface of the cooling plate of the battery pack has no defect, the inner wall of the cooling plate of the battery pack is not connected to the conductive cotton, and the resistance between the cooling plate of the battery pack and the conductive cotton is large, and it may be determined that the cooling plate and the conductive cotton are insulated. Thereby, the insulation of the outer surface of the cooling plate of the battery pack can be accurately detected.

In some embodiments, insulation requirements may be configured according to actual application scenarios. In some embodiments, the predetermined requirements may include: insulation voltage≥4 KV, and leakage current≤0.5 MA.

In some embodiments, the insulation detection device may include at least two detection positions.

In some embodiments, the positional relationship between the at least two detection positions may be determined according to actual application scenarios.

In some embodiments, the at least two detection positions are arranged side by side in a horizontal direction, or the at least two detection positions are arranged side by side in a vertical direction.

It should be noted that with the arranged at least two detection positions, cooling plates of the battery packs can be detected in batches, thereby improving the speed of detecting the cooling plates of the battery packs.

In some embodiments, the cooling plate of the battery pack may include a first surface and a second surface. A width of the first surface may be greater than a width of the second surface.

In some embodiments, a width of a slot formed by the detection position may match the width of the first surface.

Figure 2:
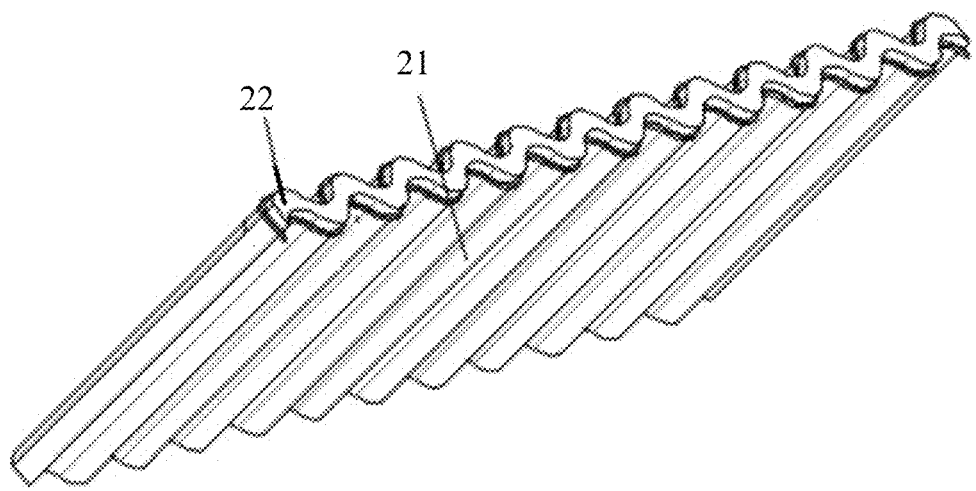
FIG. 2 is a schematic structural diagram of a cooling plate of a battery pack according to the present disclosure.

Reference is made to FIG. 2, which shows a schematic diagram of an exemplary structure of a cooling plate of a battery pack.

In FIG. 2, the width of the first surface 21 of the cooling plate of the battery pack may be greater than the width of the second surface 22 of the cooling plate of the battery pack. As an example, the second surface 22 in FIG. 2 is wavy. The width of the wavy second surface may be determined by performing the following operations. Two plates are placed close to two first surfaces of the cooling plate of the battery pack, and then a distance between the two plates may be determined as the width of the second surface.

That the width of the slot formed by the detection position matches the width of the first surface may include that the width of the slot is slightly larger than the width of the first surface.

In some embodiments, the width of the slot formed by the detection position may match the width of the second surface.

That the width of the slot formed by the detection position matches the width of the second surface may include that the width of the slot is slightly larger than the width of the second surface.

In some embodiments, the shape of the notch of the slot formed by the detection position may match the shape of the second surface. Alternatively, the shape of the notch of the slot may be rectangular.

In some embodiments, the insulation detection device shown in FIG. 1 further includes: a pressing apparatus 5. The pressing apparatus may be configured to increase the contact tightness between the conductive cotton and the cooling plate of the battery pack.

As an example, the pressing apparatus 5 in FIG. 1 may transmit pressure to the cover plate 12, and the cover plate 12 may press the conductive cotton against the cooling plate of the battery pack.

Thus, the detection accuracy can be improved. Specifically, in a case that the conductive cotton is not in sufficient contact with the insulation coating on the outer surface of the cooling plate of the battery pack, the position at which the insulation coating has a defect may not be in sufficient contact with the conductive cotton, and then it cannot be detected that the insulation coating has a defect in the insulation detection.

In some embodiments, the pressing apparatus may include a pressing element and a pressure transmission element.

For the pressing element, pressing operations may be performed according to actual application scenarios, which are not limited herein. As an example, for the pressing element, manual pressurization may be performed, and mechanical automatic pressurization may be performed.

In some embodiments, the pressing element may include a first type of pressing element. The first type of pressing element may be a manual clamp.

In some embodiments, the pressing element may include a second type of pressing element. The second type of pressing element may include a pressing cylinder and a sliding sleeve. The sliding sleeve may cooperate with a sliding shaft.

In some embodiments, in a case that there is one detection position, the pressing element may include a manual clamp, and the pressure transmission element may include a gasket in contact with the cover plate.

In some embodiments, in a case that there are multiple detection positions, the pressing element may include a second type of pressing element.

The pressure transmission element may be implemented according to actual application scenarios. In some embodiments, the pressure transmission element may include, but is not limited to, at least one of a sliding shaft, a slideway, and a spring.

The sliding shaft passes through at least two detection positions, and the spring is sleeved on the sliding shaft between adjacent detection positions. The slideway is configured, when a detection position moves along the sliding axis, to perform auxiliary positioning on the detection position.

As an example, when the pressing element presses detection positions arranged side by side, since the baffle plate is three-dimensional, the sliding shaft and the slideway may control a direction in which the baffle plate slides between the detection positions, so that the baffle plate moves along the sliding shaft and the slideway. The spring between the detection positions (that is, the spring between baffle plates) may support adjacent baffles. Under pressurization, the distance between the baffle plates decreases.

In some embodiments, the insulation detection device may include one or more pressing elements. The types of the pressing elements may be the same or different. The insulation detection device may include one or more pressure transmission elements. The types of the pressure transmission elements may be the same or different.

Figure 3:
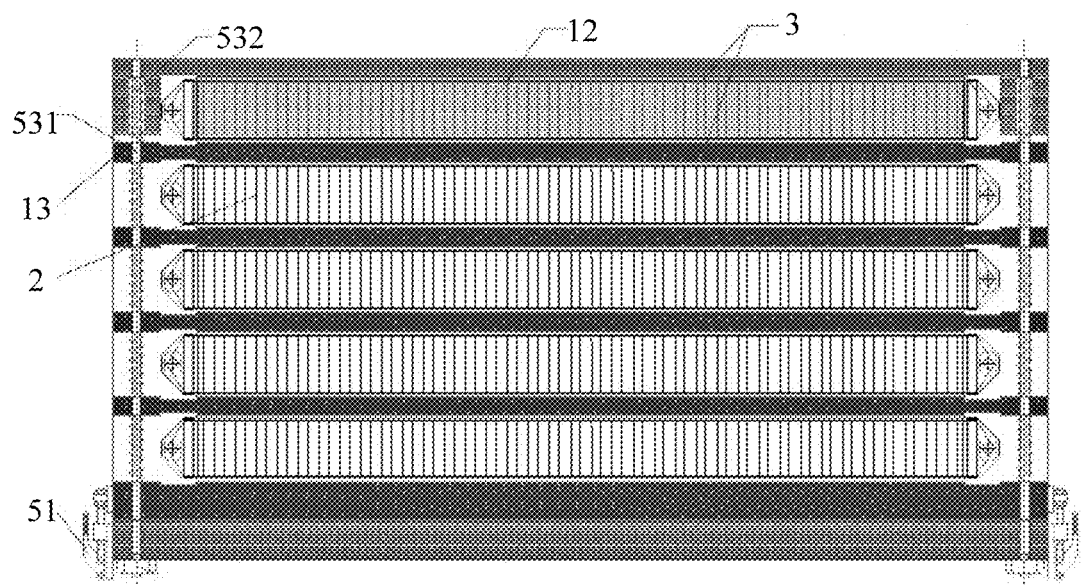
FIG. 3 is a schematic structural diagram of an insulation detection device according to an embodiment of the present disclosure.

Reference is made to FIG. 3, which shows a schematic structural diagram of an insulation detection device for a cooling plate of a battery pack according to an embodiment of the present disclosure.

In the insulation detection device shown in FIG. 3, the detection positions in the insulation detection device are arranged side by side in the horizontal direction. FIG. 3 shows a top view of the insulation detection device in operation.

In an embodiment, the cooling plate of the battery pack may be placed vertically in the detection position. That is, the first surface of the cooling plate of the battery pack is parallel to the vertical direction, and the second surface of the cooling plate of the battery pack is parallel to the horizontal direction.

In an embodiment, the cooling plate of the battery pack may be placed horizontally in the detection position. That is, the second surface of the cooling plate of the battery pack is parallel to the vertical direction, and the first surface of the cooling plate of the battery pack is parallel to the horizontal direction.

As shown in FIG. 3, the first surface of the cooling plate of the battery pack is parallel to the horizontal direction, and the second surface of the cooling plate of the battery pack is parallel to the vertical direction.

The detection position shown in FIG. 3 may include a bottom plate (not shown in FIG. 3), a cover plate 12 and baffle plates 13. The bottom plate is arranged below the detection positions. The detection positions may share the same bottom plate, and the detection positions may have independent bottom plates. The cover plate is arranged above the detection positions. The detection positions may share the same cover plate, and the detection positions may have independent cover plates. Adjacent detection positions may be isolated by baffle plates.

A to-be-detected cooling plate 2 of the battery pack may be placed in a detection position. The cooling plate of the battery pack may be placed in a detection position first, and then the detection positions are assembled; or the detection positions are assembled first, and then the cooling plate of the battery pack is placed in a detection position from a side of the detection position.

The cooling plate of the battery pack in the detection position may be wrapped with conductive cotton 3.

In an embodiment, the insulation detection device shown in FIG. 3 may include a pressing apparatus. The pressing apparatus may include a first type of pressing element 51 and a pressure transmission element.

In an embodiment, the first type of pressing element may include one or more compression clips.

In the embodiment, the pressure transmission element may include a sliding shaft 531, a spring 532 and a bolt.

In the insulation detection device shown in FIG. 3, after the cooling plate of the battery pack wrapped with the conductive cotton is placed in the detection position, the conductive cotton and the cooling plate of the battery pack may be clamped in the horizontal direction by using the first type of pressing element 51, and the conductive cotton and the cooling plate of the battery pack may be further clamped in the vertical direction by using the first type of pressing element arranged in the vertical direction.

It should be noted that with the insulation detection device shown in FIG. 3, the detection positions are arranged side by side in the horizontal direction, to-be-detected cooling plates of battery packs may be quickly placed in the detection positions to perform detection, performing detection on multiple cooling plates of battery packs simultaneously, and thereby improving detection efficiency.

Figure 4:
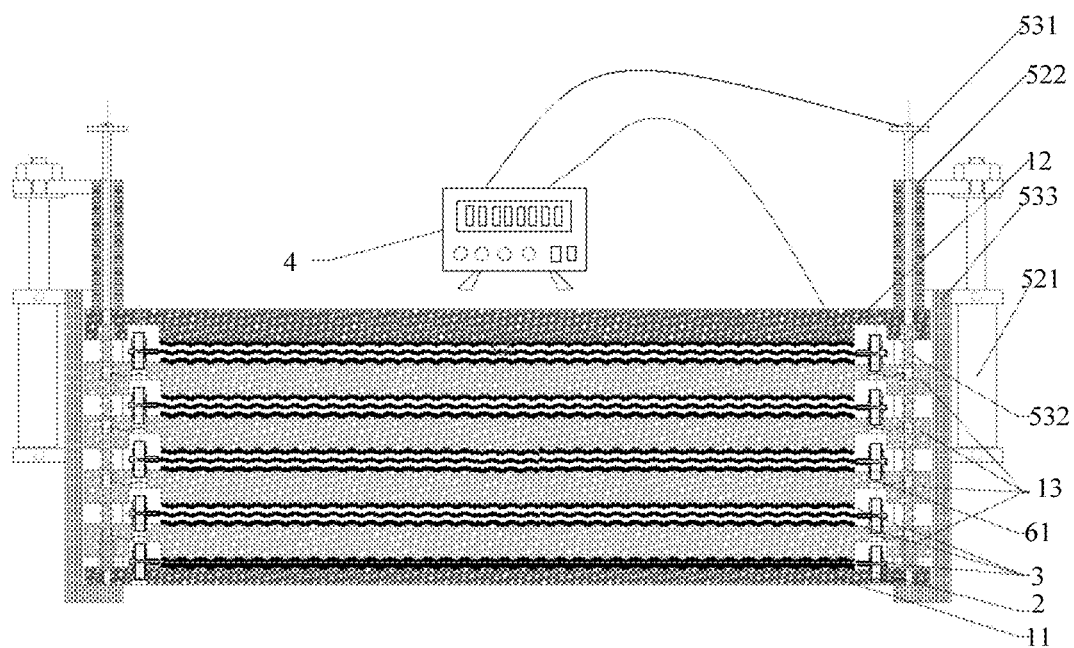
FIG. 4 is a schematic structural diagram of an insulation detection device according to an embodiment of the present disclosure.

Reference is made to FIG. 4, which shows a schematic structural diagram of an insulation detection device for a cooling plate of a battery pack according to an embodiment of the present disclosure. In the insulation detection device shown in FIG. 4, the detection positions in the insulation detection device are arranged side by side in the vertical direction.

In an embodiment, the cooling plate of the battery pack may be placed vertically in the detection position. That is, the first surface of the cooling plate of the battery pack is parallel to the vertical direction, and the second surface of the cooling plate of the battery pack is parallel to the horizontal direction.

In an embodiment, the cooling plate of the battery pack may be placed horizontally in the detection position. That is, the second surface of the cooling plate of the battery pack is parallel to the vertical direction, and the first surface of the cooling plate of the battery pack is parallel to the horizontal direction.

As shown in FIG. 4, the first surface of the cooling plate of the battery pack is parallel to the horizontal direction, and the second surface of the cooling plate of the battery pack is parallel to the vertical direction.

The detection positions shown in FIG. 4 may include a bottom plate 11, a cover plate 12, and baffle plates 13. The bottom plate is arranged below a lowest detection position, and the cover plate is arranged above an uppermost detection position. The adjacent detection positions may be isolated by baffle plates.

A to-be-detected cooling plate 2 of the battery pack may be placed in a detection position. The cooling plate of the battery pack may be placed in a detection position first, and then the detection positions are assembled; or the detection positions are assembled first, and then the cooling plate of the battery pack is placed in a detection position from a side of the detection position.

The cooling plate of the battery pack in the detection position may be wrapped with conductive cotton 3.

In an embodiment, the pressing apparatus shown in FIG. 4 may include a second type of pressing element and a pressure transmission element.

As shown in FIG. 4, the second type of pressing element may include a pressing cylinder 521 and a sliding sleeve 522.

As shown in FIG. 4, the pressure transmission element may include a sliding shaft 531, a spring 532, and a slideway 533.

In an embodiment, with the insulation detection device shown in FIG. 4, a cooling plate of a battery pack wrapped with conductive cotton may be placed in a lowest detection position first, then a baffle plate is placed on the lowest detection position, then a cooling plate of a battery pack wrapped with conductive cotton is placed on the baffle plate, and then a baffle plate is placed, and so on, until a cover plate is placed on an uppermost detection position. Then, the conductive cotton and the cooling plates of the battery packs may be clamped in the vertical direction by using the pressing element and the pressure transmission element that are arranged in the vertical direction. And then, the conductive cotton and the cooling plates of the battery packs may be clamped in the horizontal direction by using the pressing element and the pressure transmission element that are arranged in the horizontal direction.

The first conductive element 61 shown in FIG. 4 may be electrically connected to the inner wall of the cooling plate of the battery pack, and may be connected to the first end of the insulation detector via the sliding shaft or the like. The second end of the insulation detector is connected to the conductive cotton.

It should be noted that with the insulation detection device shown in FIG. 4, the detection positions are arranged side by side in the vertical direction, thus detection can be performed on multiple cooling plates of battery packs simultaneously, improving detection efficiency. Moreover, with the detection positions arranged side by side in the vertical direction, the footprint of the insulation detection device can be reduced, thereby reducing the requirements for the use site of the insulation detection device and improving the convenience of using the insulation detection device.

Figure 5:
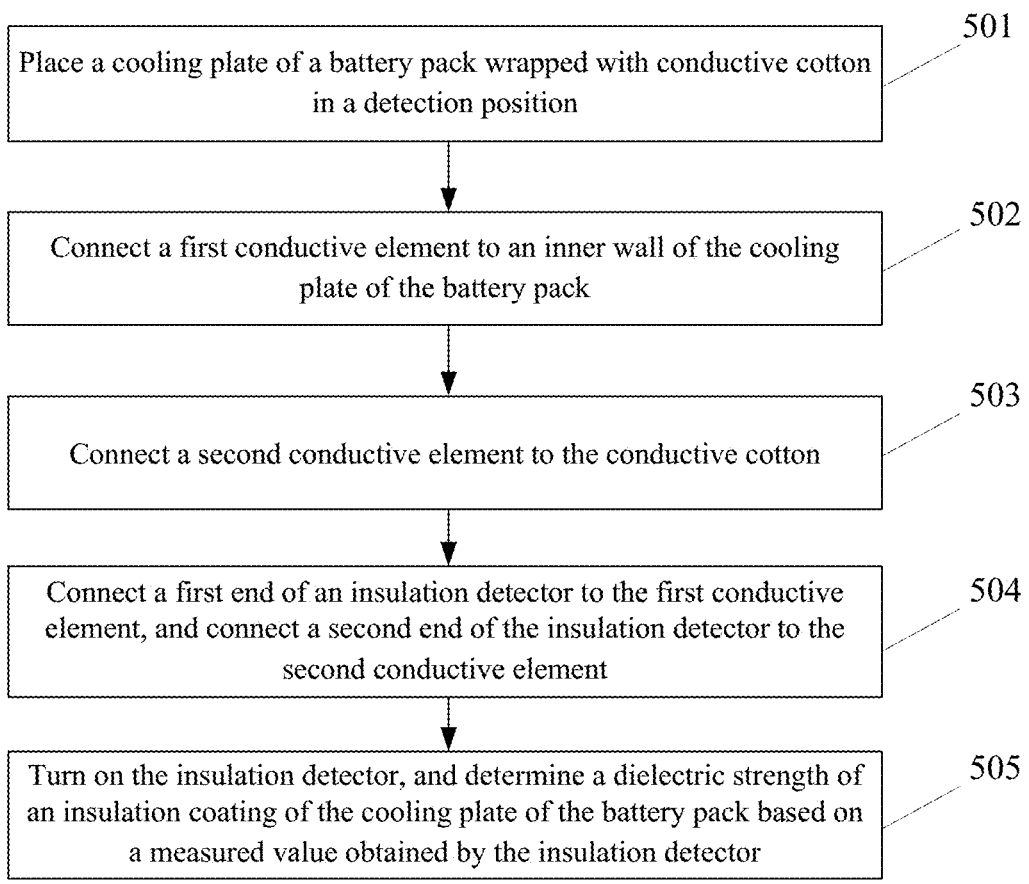
FIG. 5 is a flow chart of an insulation detection method according to an embodiment of the present disclosure.

Reference is made to FIG. 5, which shows a flow chart of an insulation detection method according to an embodiment of the present disclosure. The insulation detection method may be applied to the insulation detection device according to the embodiments of the present disclosure.

As shown in FIG. 5, the insulation detection method includes the following steps 501 to 505.

In step 501, a cooling plate of a battery pack wrapped with conductive cotton is placed in a detection position.

The cooling plate of the battery pack is hollow, and the outer surface of the cooling plate of the battery pack is coated with the insulation coating.

In step 502, the first conductive element is connected to the inner wall of the cooling plate of the battery pack.

The first conductive element may be directly or indirectly connected to the inner wall of the cooling plate of the battery pack.

In step 503, the second conductive element is connected to the conductive cotton.

In step 504, the first end of the insulation detector is connected to the first conductive element, and the second end of the insulation detector is connected to the second conductive element.

In step 505, the insulation detector is turned on, and a dielectric strength of the insulation coating of the cooling plate of the battery pack is determined based on a measured value obtained by the insulation detector.

In some embodiments, the insulation detection device includes at least two detection positions arranged side by side in the vertical direction.

The step 502 may include: placing the cooling plate of the battery pack wrapped with the conductive cotton in a lowest detection position; placing a baffle plate above the lowest detection position; placing a cooling plate of the battery pack wrapped with the conductive cotton on the baffle plate, and then placing a baffle plate; and circularly placing a cooling plate of the battery pack and a baffle plate, and finally placing a cover plate on an uppermost detection position.

In some embodiments, the insulation detection device includes the pressing apparatus for increasing the contact tightness between the conductive cotton and the cooling plate of the battery pack.

In some embodiments, the insulation detection method further includes: clamping the conductive cotton and the cooling plate of the battery pack in the horizontal direction by using a pressing apparatus arranged in the horizontal direction; and clamping the conductive cotton and the cooling plate of the battery pack in the vertical direction by using a pressing apparatus arranged in the vertical direction.

It should be noted that, by using the insulation detection method according to the embodiments, the insulation detection device can be operated conveniently and quickly, and the insulation strength of the cooling plate of the battery pack can be quickly and accurately detected.

Specifically, in a case that the cooling plate of the battery pack is connected to the conductive cotton due to a defect in the insulation coating on the outer surface of the battery pack, the resistance between the inner wall of the cooling plate of the battery pack and the conductive cotton is small, and an electrical path is formed; and in a case that the insulation coating on the outer surface of the cooling plate of the battery pack has no defect, the inner wall of the cooling plate of the battery pack is not connected to the conductive cotton, and the resistance between the cooling plate of the battery pack and the conductive cotton is large, and it may be determined that the cooling plate and the conductive cotton are insulated. Thereby, the insulation of the outer surface of the cooling plate of the battery pack can be accurately detected.

The above description includes merely preferred embodiments of the present disclosure and explanations of technical principles used. Those skilled in the art should understand that the scope of the present disclosure is not limited to technical solutions formed by a specific combination of the above technical features, but covers other technical solutions formed by any combination of the above technical features or equivalent features thereof without departing from the concept of the present disclosure. For example, a technical solution formed by interchanging the above features with technical features having similar functions as disclosed (but not limited thereto) is also covered in the scope of the present disclosure.

In addition, although the operations are described in a specific order, it should not be understood that these operations are to be performed in the specific order shown or performed in a sequential order. Under certain circumstances, multitasking and parallel processing may be advantageous. Although the specific implementation details are described above, these implementation details should not be construed as limiting the scope of the present disclosure. The features described in multiple separate embodiments may be implemented in combination in a separate embodiment. Conversely, the features described in a separate embodiment may be implemented in multiple embodiments individually or in any suitable sub-combination.

Although the solutions according to the present disclosure have been described in language specific to structural features and/or logical actions of the method, it should be understood that the solutions defined in the appended claims are unnecessarily limited to the specific features or actions described above. The specific features and actions described above are merely exemplary forms of implementing the claims.

The invention claimed is:

1. An insulation detection device for a cooling plate of a battery pack, comprising:
   a detection position for placing the cooling plate of the battery pack, wherein the cooling plate of the battery pack is hollow, and an outer surface of the cooling plate of the battery pack is coated with an insulation coating;
   conductive cotton, arranged in the detection position for wrapping the cooling plate of the battery pack;
   a first conductive element for connecting to an inner wall of the cooling plate of the battery pack;
   a second conductive element for connecting to the conductive cotton;
   an insulation detector, wherein a first end of the insulation detector is connected to the first conductive element, and a second end of the insulation detector is connected to the second conductive element; and
   a pressing apparatus, configured to increase a contact tightness between the conductive cotton and the cooling plate of the battery pack; wherein
   the pressing apparatus comprises a pressure transmission element; and wherein
   the pressure transmission element comprises a sliding shaft, a slideway, and a spring;
   the sliding shaft passes through at least two detection positions, and the spring is sleeved on the sliding shaft between adjacent detection positions; and
   the slideway is configured, when a detection position moves along the sliding shaft, to perform auxiliary positioning on the detection position.

2. The insulation detection device according to claim 1, wherein the insulation detection device comprises at least two detection positions.

3. The insulation detection device according to claim 2, wherein the at least two detection positions are arranged side by side in a horizontal direction, or the at least two detection positions are arranged side by side in a vertical direction.

4. The insulation detection device according to claim 1, wherein
   the cooling plate of the battery pack comprises a first surface and a second surface, and a width of the first surface is greater than a width of the second surface; and
   a width of a slot formed by the detection position matches the width of the first surface or the width of the second surface.

5. The insulation detection device according to claim 1, wherein
   the pressing element comprises at least one of a first type of pressing element and a second type of pressing element; and
   manual pressurization is performed with the first type of pressing element, and mechanical power pressurization is performed with the second type of pressing element.

6. An insulation detection method for a first cooling plate of a battery pack, wherein the method is applied to the insulation detection device according to claim 1, and the method comprises:
   placing the first cooling plate of the battery pack wrapped with a first conductive cotton in the detection position, wherein the first cooling plate of the battery pack is hollow, and the outer surface of the first cooling plate of the battery pack is coated with the insulation coating;
   connecting the first conductive element to the inner wall of the first cooling plate of the battery pack;
   connecting the second conductive element to the first conductive cotton;
   connecting the first end of the insulation detector to the first conductive element, and connecting the second end of the insulation detector to the second conductive element; and
   turning on the insulation detector, and determining a dielectric strength of the insulation coating of the first cooling plate of the battery pack based on a measured value obtained by the insulation detector; wherein
   the insulation detection device comprises at least two detection positions arranged side by side in the vertical direction; and
   placing the first cooling plate of the battery pack wrapped with the first conductive cotton in the detection position comprises:
   placing the first cooling plate of the battery pack wrapped with the first conductive cotton in a lowest detection position;
   placing a first baffle plate above the lowest detection position;
   placing a second cooling plate of the battery pack wrapped with a second conductive cotton on the first baffle plate, and then placing a second baffle plate; and
   placing a cover plate on an uppermost detection position.

7. The insulation detection method according to claim 6, wherein
   the insulation detection method further comprises:
   clamping the first conductive cotton and the first cooling plate of the battery pack in the horizontal direction by using a pressing apparatus arranged in the horizontal direction; and
   clamping the first conductive cotton and the first cooling plate of the battery pack in the vertical direction by using a pressing apparatus arranged in the vertical direction.

* * * * *